United States Patent
Son et al.

(10) Patent No.: US 8,304,318 B2
(45) Date of Patent: *Nov. 6, 2012

(54) METHODS OF FABRICATING MOS TRANSISTORS HAVING RECESSES WITH ELEVATED SOURCE/DRAIN REGIONS

(75) Inventors: Yong-Hoon Son, Gyeonggi-do (KR);
Si-Young Choi, Gyeonggi-do (KR);
Byeong-Chan Lee, Gyeonggi-do (KR);
Deok-Hyung Lee, Gyeonggi-do (KR);
In-Soo Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/241,311

(22) Filed: Sep. 23, 2011

(65) Prior Publication Data

US 2012/0034746 A1      Feb. 9, 2012

Related U.S. Application Data

(60) Continuation of application No. 12/582,073, filed on Oct. 20, 2009, now Pat. No. 8,039,350, which is a division of application No. 10/886,167, filed on Jul. 7, 2004, now Pat. No. 7,683,405.

(30) Foreign Application Priority Data

Jul. 7, 2003  (KR) .................................. 2003-45787

(51) Int. Cl.
*H01L 21/336* (2006.01)
(52) U.S. Cl. .......... 438/300; 257/E21.619; 257/E21.634
(58) Field of Classification Search .................. 438/142, 438/197, 199, 299–306, 343, 365; 257/E21.133, 257/E21.409, E21.421, E21.431, E21.438
See application file for complete search history.

(56) References Cited

U.S. PATENT DOCUMENTS

| | | | |
|---|---|---|---|
| 4,998,150 A | 3/1991 | Rodder et al. | |
| 5,200,352 A | 4/1993 | Pfiester | 257/344 |
| 5,397,909 A | 3/1995 | Moslehi | 257/383 |
| 5,677,214 A | 10/1997 | Hsu | 257/29.04 |
| 5,908,313 A | 6/1999 | Chau et al. | 257/29 |
| 5,915,183 A | 6/1999 | Gambino et al. | 257/29 |
| 6,090,691 A | 7/2000 | Ang et al. | 438/564 |
| 6,114,209 A | 9/2000 | Chu et al. | 257/29 |
| 6,368,926 B1 | 4/2002 | Wu | 438/300 |
| 6,395,621 B1 * | 5/2002 | Mizushima et al. | 438/486 |
| 6,440,807 B1 | 8/2002 | Ajmera et al. | 438/300 |
| 6,580,134 B1 | 6/2003 | Song et al. | 257/384 |
| 6,765,273 B1 | 7/2004 | Chau et al. | 257/412 |
| 2002/0195660 A1 | 12/2002 | Lee | 257/344 |

FOREIGN PATENT DOCUMENTS

| | | |
|---|---|---|
| JP | 2002-151682 | 5/2002 |
| KR | 2000-0065719 | 11/2000 |
| KR | 10-0332108 | 4/2002 |

* cited by examiner

*Primary Examiner* — Brook Kebede
(74) *Attorney, Agent, or Firm* — Myers Bigel Sibley & Sajovec

(57) ABSTRACT

Methods of fabricating metal-oxide-semiconductor (MOS) transistors having elevated source/drain regions are provided. The MOS transistors formed by these methods may include a gate pattern formed to cross over a predetermined region of a substrate. Recessed regions are provided in the substrate adjacent to the gate pattern. Epitaxial layers are provided on bottom surfaces of the recessed regions. High concentration impurity regions are provided in the epitaxial layers. The recessed regions may be formed using a chemical dry etching techniques.

10 Claims, 9 Drawing Sheets

METHODS OF FABRICATING MOS TRANSISTORS HAVING RECESSES WITH ELEVATED SOURCE/DRAIN REGIONS

CROSS-REFERENCE TO RELATED APPLICATION

This application claims priority under 35 U.S.C. §120 as a continuation of U.S. application Ser. No. 12/582,073, filed Oct. 20, 2009 now U.S. Pat. No. 8,039,350 which is a divisional of U.S. application Ser. No. 10/886,167, filed Jul. 7, 2004 now U.S. Pat. No. 7,683,405, which in turn claims priority under 35 U.S.C. §119 from Korean Patent Application No. 2003-45787, filed Jul. 7, 2003. The disclosure of each of these applications is incorporated herein by reference in its entirety.

FIELD OF THE INVENTION

The present invention relates to semiconductor devices and, more particularly, to metal-oxide-semiconductor (MOS) transistors and methods of fabricating such transistors.

BACKGROUND OF THE INVENTION

As semiconductor devices having metal-oxide-semiconductor (MOS) transistors become more highly integrated, the contact sizes and junction depths of the source/drain regions of these devices have been reduced. Accordingly, a salicide (self-aligned silicide) technique is widely used in the fabrication of highly integrated MOS transistor semiconductor devices in order to allow improvement in certain electrical characteristics of the MOS transistors such as the contact resistance of the source/drain regions. However, if metal silicide layers are formed on shallow source/drain junctions, the junction leakage current of the source/drain regions may be increased. Thus, the use of elevated source/drain structures has been proposed to help reduce and/or minimize the contact resistance. Such a technique is discussed in U.S. Pat. No. 6,440,807 to Ajmera et al.

FIGS. 1 to 3 are cross-sectional views illustrating a conventional method of fabricating a semiconductor device that is described in U.S. Pat. No. 6,440,807.

As shown in FIG. 1, a gate insulating layer 52 is formed on a semiconductor substrate 50. A polysilicon pattern 54 and a silicon nitride pattern 56 are sequentially stacked on the gate insulating layer 52. Sidewall spacers 60 are formed on sidewalls of the polysilicon pattern 54. The sidewall spacers 60 may be formed of silicon nitride. Source/drain regions 64 are formed in the semiconductor substrate 50 adjacent both sides of the polysilicon pattern 54. The source/drain regions 64 may be formed using an ion implantation process and an annealing process.

As shown in FIG. 2, an epitaxial layer 62 is grown on the source/drain regions 64 to provide elevated source/drain structures. The epitaxial layer 62 is not grown on the polysilicon pattern 54, since the polysilicon pattern 54 is surrounded by the silicon nitride pattern 56 and the insulating sidewall spacers 60. Then, as shown in FIG. 3, the silicon nitride pattern 56 is removed, and a metal silicide layer (not shown) may be formed on the polysilicon pattern 54 and the epitaxial layer 62 to lower the contact resistance of the polysilicon pattern 54 and the source/drain regions 64.

Even though the source/drain regions 64 may be formed to have a shallow junction depth, the elevated source/drain structures may provide sufficient junction depth to reduce and/or minimize the junction leakage current of the source/drain regions 64. Accordingly, by forming the metal silicide layer in the epitaxial layer 62, it may be possible to provide a device having a shallow junction depth and a relatively low contact resistance.

As noted above, epitaxial growth techniques may be used to form MOS transistors having elevated source/drain structures. However, if crystalline defects or contaminants exist at the surface of the substrate, it may be difficult to form a uniform epitaxial layer on the defective surface. For example, if impurity ions are implanted into a single crystalline semiconductor substrate, an amorphous layer may be formed at the surface of the substrate to a depth of, for example, about 300 angstroms. Such an amorphous layer may lead to an abnormal epitaxial layer. This may be particularly true in cases where P-type impurity ions are implanted into the semiconductor substrate.

As noted above, in the methods discussed in U.S. Pat. No. 6,440,807, the epitaxial layer is grown on source/drain regions that are formed using an ion implantation process and an annealing process. The ion implantation process typically generates crystalline defects or an amorphous layer at the surface of the substrate. Thus, U.S. Pat. No. 6,090,691 discloses a method of fabricating elevated source/drain structures without use of an epitaxial layer.

The crystalline defects, which are due to the ion implantation damage, can be reduced, minimized and/or eliminated by increasing the annealing process time or raising the annealing temperature. However, increasing the annealing process time and/or the annealing temperature tends to cause additional diffusion of the impurity ions in the extension regions which can lead to a short channel effect with the MOS transistor.

SUMMARY OF THE INVENTION

Pursuant to embodiments of the present invention, MOS transistors are provided that have elevated source/drain regions. In certain embodiments of the invention, the MOS transistors include a semiconductor substrate that has first and second recesses therein. A gate electrode is provided on the semiconductor substrate between the first recess and the second recess. A first impurity doped region is provided in the semiconductor substrate below the first recess, and a second impurity doped region is provided in the semiconductor substrate below the second recess. An impurity doped epitaxial layer is provided on both the first impurity doped region and the second impurity doped region that at least partially fills the first and second recesses. A metal silicide layer is provided on the impurity doped epitaxial layer.

The top surface of the metal silicide layer may be higher than the semiconductor substrate. The MOS transistor may also include a third impurity doped region in the semiconductor substrate between the first impurity doped region and the gate electrode and a fourth impurity doped region in the semiconductor substrate between the second impurity doped region and the gate electrode. A first sidewall spacer may be provided on the third impurity doped region and a second sidewall spacer may be provided on the fourth impurity doped region such that end portions of the first and second recesses are aligned respective outer walls of the first and second sidewall spacers. The first and second impurity doped regions may have a higher concentration of impurities and/or extend deeper into the semiconductor substrate than the third and fourth impurity doped regions. In certain embodiments of the present invention, the first and second recesses may have a depth of between about 50 Angstroms and about 200 Angstroms.

In further embodiments of the present invention, MOS transistors are provided that have a gate pattern on a semiconductor substrate. A first sidewall spacer is provided adjacent to a first sidewall of the gate pattern and a second sidewall spacer is provided adjacent to a second sidewall of the gate pattern. A first recessed region is included in the semiconductor substrate that is aligned with an outer wall of the first sidewall spacer and a second recessed region is included in the semiconductor substrate that is aligned with an outer wall of the second sidewall spacer. First and second epitaxial layers are provided on the first and second recessed regions, respectively. A first impurity region is provided in the semiconductor substrate under the first sidewall spacer and a second impurity region is provided in the semiconductor substrate under the second sidewall spacer. In these embodiments, the first epitaxial layer and the semiconductor substrate below the first epitaxial layer may comprise a first high concentration impurity region that extends deeper into the semiconductor substrate than the first extended impurity region and the second epitaxial layer and the semiconductor substrate below the second epitaxial layer may comprise a second high concentration impurity region that extends deeper into the semiconductor substrate than the second extended impurity region.

In these transistors, the concentration of impurities at top surfaces of the first and second high concentration impurity regions may be higher than the concentration of impurities at bottom surfaces of the first and second high concentration impurity regions. The transistor may also include metal silicide layers on the first and second epitaxial layers. The impurity concentration of the upper portions of the first and second epitaxial layers may be greater than the impurity concentration of the lower portions of the first and second epitaxial layers.

Pursuant to still further embodiments of the present invention, method of forming MOS transistors are provided. Pursuant to these methods, a gate pattern is formed on a semiconductor substrate. Impurity ions are implanted in the semiconductor substrate to form a first impurity doped region on a first side of the gate pattern and a second impurity doped region on a second side of the gate pattern. Portions of the first and second impurity doped regions are then removed to form respective first and second recesses, and an epitaxial layer is formed on the first and second impurity doped regions that at least partially fills the first and second recesses. Finally, impurity ions are implanted in the epitaxial layer to form a first high concentration impurity doped region adjacent the first side of the gate pattern and a second high concentration impurity doped region adjacent the second side of the gate pattern.

In these methods, a chemical dry etching technique may be used to form the first and second recesses and/or selective epitaxial growth techniques may be used to form the epitaxial layer. First and second sidewall spacers may also be formed on the respective first and second sidewalls of the gate pattern prior to the removal of portions of the first and second impurity doped regions. The first and second high concentration impurity doped regions may be formed such that they extend into the semiconductor substrate below the epitaxial layer. The methods may also include forming a metal silicide layer on the epitaxial layer. The top surface of the metal silicide layer may be higher than the semiconductor substrate. In these methods, the processing steps subsequent to the formation of the first and second impurity doped regions may all be carried out at a temperature of less than 700 degrees Celsius.

The methods may also include cleaning the semiconductor substrate before and/or after the chemical dry etching technique.

DETAILED DESCRIPTION OF THE INVENTION

Figure 1:
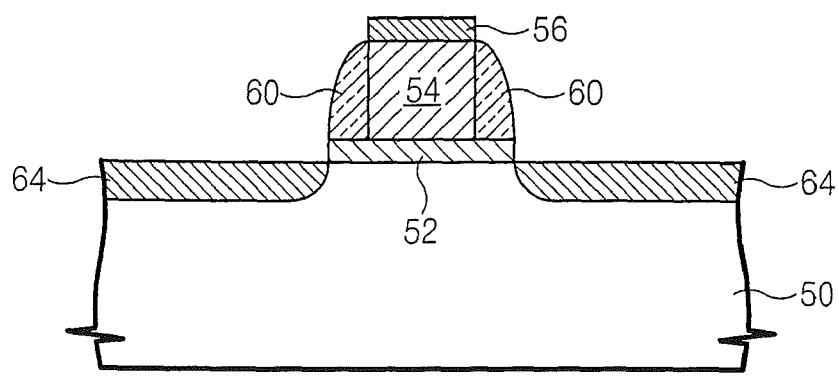
FIGS. 1 to 3 are cross sectional views illustrating a conventional method of fabricating a MOS transistor having elevated source/drain regions.
Figure 2:
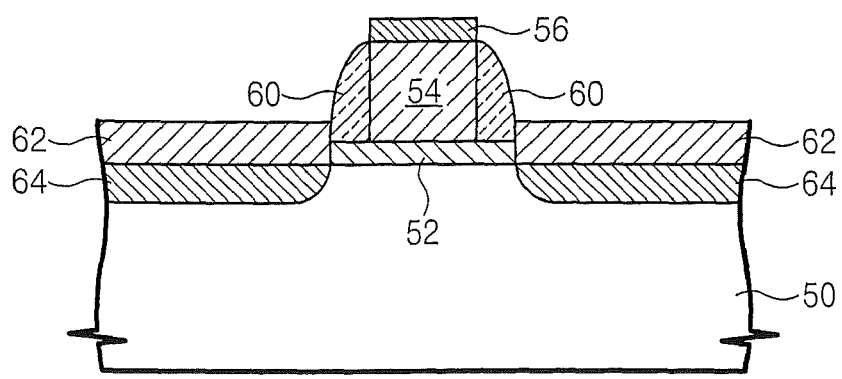
Figure 3:
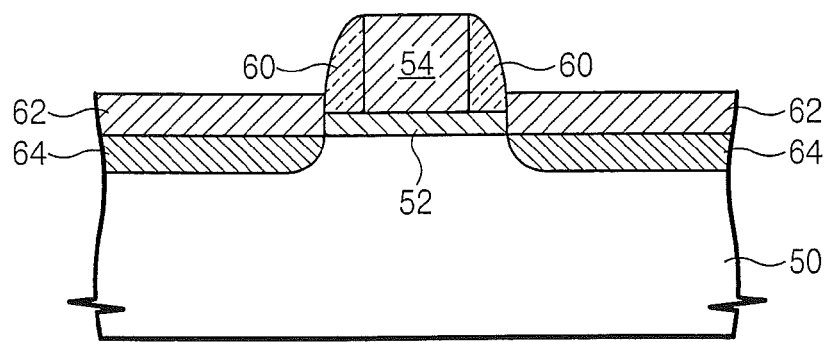

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Similarly, when a layer or element is referred to as being "below" another layer or element, it can be directly below the other layer or element, or intervening layers and/or elements may also be present. When a layer, element or region is referred to as being "between" two other layers, elements and/or regions, intervening layers, elements or regions may also be present. Furthermore, relative terms such as "lower" or "upper" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various embodiments, elements, components, regions, layers and/or sections, these embodiments, elements, components, regions, layers and/or sections should not be limited by these terms. These terms are only used to distinguish one embodiment, element, component, region, layer or section from another region, layer or section. Thus, a first embodiment, region, layer or section discussed below could be termed a second embodiment, region, layer or section, and, similarly, a second embodiment, region, layer or section could be termed a first embodiment, region, layer or section without departing from the teachings of the present invention.

Figure 4:
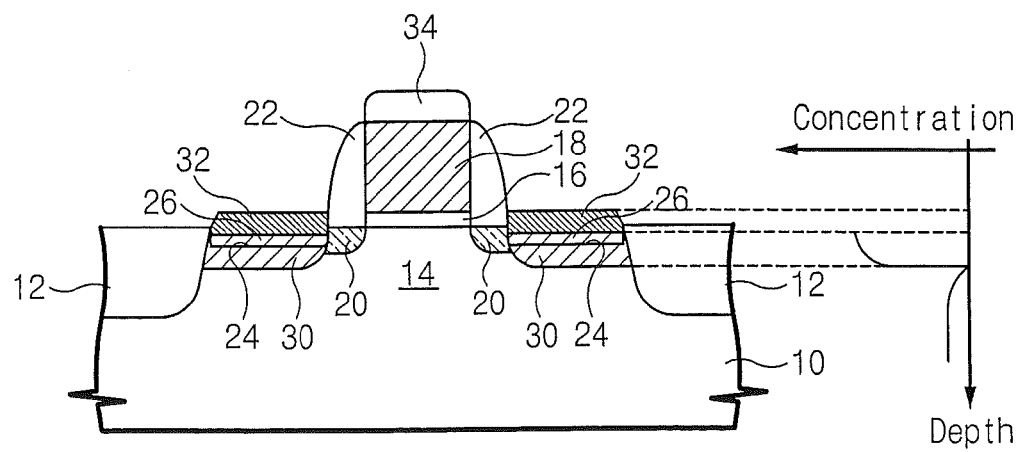
FIG. 4 is a cross sectional view illustrating MOS transistors according to certain embodiments of the present invention.

FIG. 4 is a cross sectional view illustrating MOS transistors according to certain embodiments of the present invention. As shown in FIG. 4, an isolation layer 12 is provided in a semiconductor substrate 10 to define an active region 14. A gate pattern 18 is disposed to cross over the active region 14. A gate insulating layer 16 may be interposed between the gate pattern 18 and the active region 14, and sidewalls of the gate pattern 18 may be covered with sidewall spacers 22. Two spaced apart recessed regions 24 may be provided in the active region 14 in the semiconductor substrate 10. An end of each recessed region 24 may be aligned with an outer wall of respective of the sidewall spacers 22. Epitaxial layers 26 may be provided on the recessed regions 24. The top surfaces of the epitaxial layers 26 may be higher than the initial surface of the active region 14. The epitaxial layers 26 may be doped with impurity ions having a different conductivity type from the semiconductor substrate 10 to provide high concentration impurity regions 30 that act as high concentration source/drain regions. For example, when the semiconductor substrate 10 is a P-type substrate, the epitaxial layers 26 may be doped with N-type impurity ions, whereas when the semiconductor substrate 10 is an N-type substrate, the epitaxial layers 26 may be doped with P-type impurity ions. The high concentration impurity regions 30 may extend into the active region 14 under the doped epitaxial layers 26. An impurity concentration of the upper portions of the epitaxial layers 26 may be equal to or higher than the impurity concentration of the lower portions of the epitaxial layers 26.

Extended impurity regions 20 may also be provided in the active region 14 under the sidewall spacers 22. Such extended impurity regions 20 may be located adjacent to the high concentration impurity regions 30. The extended impurity regions 20 may have the same conductivity type as the high concentration impurity regions 30. Typically, the high concentration impurity regions 30 have a higher concentration of impurity ions as compared to extended impurity regions 20. The high concentration impurity regions 30 may also be deeper than the extended impurity regions 20. The impurity concentration in the epitaxial layers 26 is higher than the impurity concentration in the active region 14 under the epitaxial layers 26. Furthermore, the high concentration impurity regions 30 may have a gradient concentration profile so that the impurity concentration at the top surfaces of the high concentration regions 30 is higher than that at the bottom surfaces of the high concentration impurity regions 30.

Silicide layers 32 may be provided on, or in the top portion of, the epitaxial layers 26. These silicide layers 32 may help reduce and/or minimize the contact resistance of the source/drain regions 30. An epitaxial layer (not shown in FIG. 4) may be provided on the gate pattern 18, and a silicide layer 34 may be provided at the top surface of the epitaxial layer on the gate pattern 18.

Figure 5:
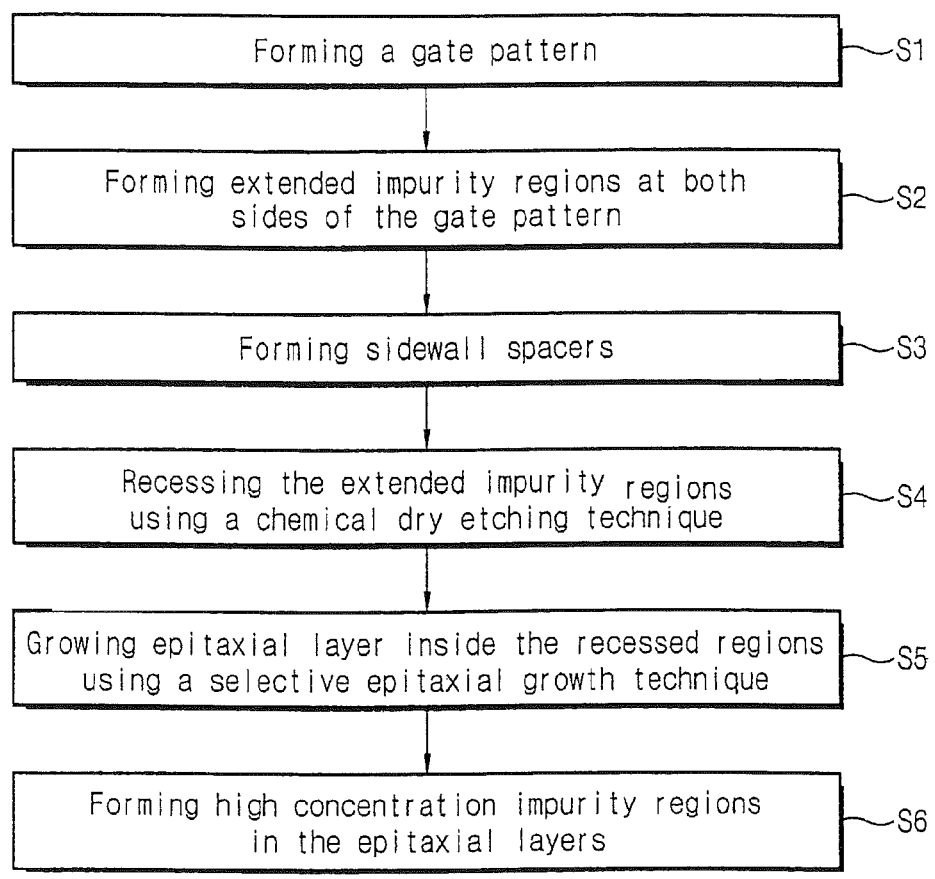
FIG. 5 is a process flow chart illustrating methods of fabricating MOS transistors according to certain embodiments of the present invention.

FIG. 5 is a process flowchart that illustrates methods of fabricating MOS transistors according to certain embodiments of the present invention. FIGS. 6 to 12 are cross sectional views that illustrate methods of fabricating MOS transistors according to certain embodiments of the present invention.

Figure 6:
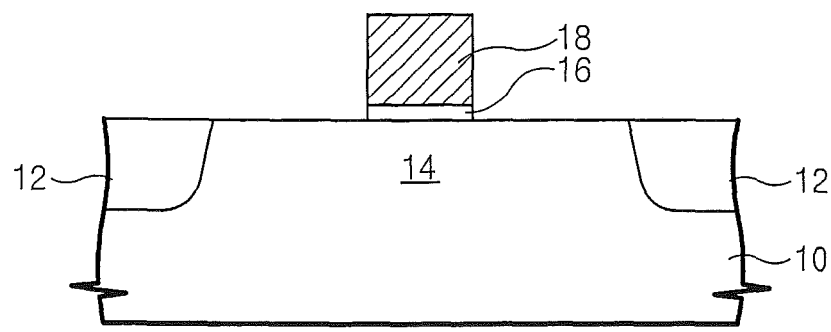
FIGS. 6 to 12 are cross sectional views illustrating methods of fabricating MOS transistors according to certain embodiments of the present invention.

Referring to FIGS. 5 and 6, an isolation layer 12 is formed at a semiconductor substrate 10 to define an active region 14. A gate insulating layer 16 is formed on the active region 14. A gate layer is formed on the semiconductor substrate 10 and the gate insulating layer 16. The gate layer is selectively etched to form a gate pattern 18 that crosses over the active region 14 (step S1 of FIG. 5).

Figure 7:
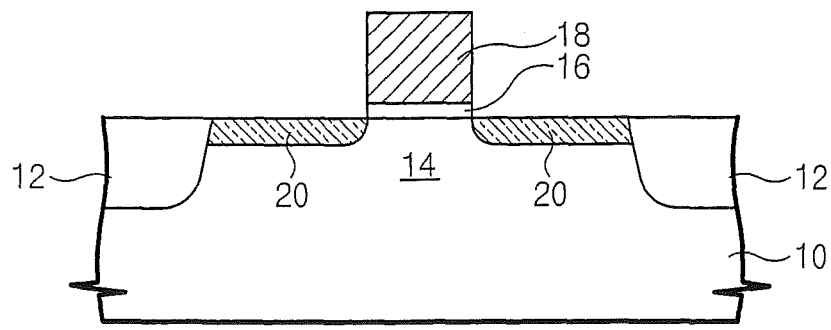

Referring to FIGS. 5 and 7, impurity ions are implanted into the active region 14 using the gate pattern 18 as an ion implantation mask, thereby forming extended impurity regions 20 on each side sides of the gate pattern 18 (step S2 of FIG. 5). The implanted impurity ions have a different conductivity type than the conductivity type of the semiconductor substrate 10. For example, when the semiconductor substrate 10 is a P-type substrate, the extended impurity regions 20 may be doped with N-type impurity ions. In certain embodiments of the present invention, the impurity ions used to form the extended impurity regions 20 may be implanted with a dose of about $1\times10^{14}$ ions/cm$^2$ to $1\times10^{16}$ ions/cm$^2$.

Figure 8:
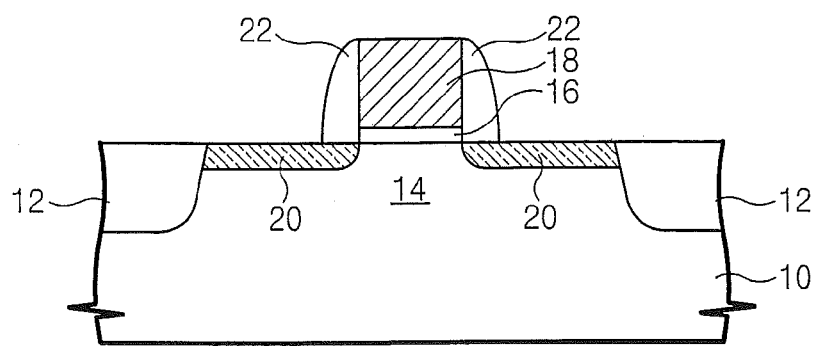

As shown in FIGS. 5 and 8, sidewall spacers 22 may be formed on sidewalls of the gate pattern 18 (step S3 of FIG. 5). The sidewall spacers 22 may be formed using, for example, conventional methods for forming sidewall spacers that are well known in the art. The sidewall spacers 22 may, for example, comprise silicon oxide or silicon nitride sidewall spacers.

Figure 9:
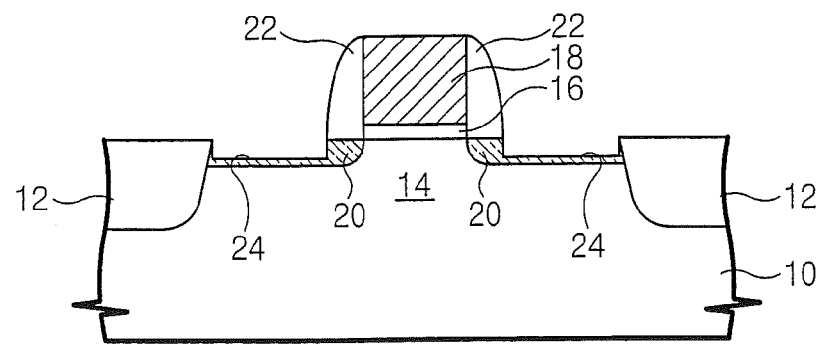

Referring to FIGS. 5 and 9, portions of the active region 14 adjacent to the sidewall spacers 22 may be recessed using, for example, chemical dry etching techniques that use remote plasma. The portions of the active region 14 that are removed by the chemical dry etching may include areas that have crystalline defects or other damage that resulted from the ion implantation step discussed above. These crystalline defects may cause an abnormal growth in epitaxial layers that are grown on the extended impurity regions 20. To reduce and/or minimize such abnormal epitaxial growth, in certain embodiments of the present invention the top portions of the extended impurity regions 20 are etched by about 50 angstroms to 200 angstroms in order to remove at least some of any defective layers which are generated by the ion implantation process. As a result of the chemical dry etching (or other removal process), recessed regions 24 are formed adjacent to the sidewall spacers 22 (step S4 of FIG. 5). The recessed regions 24 may be deeper or shallower than the extended impurity regions 20.

Chemical dry etching techniques may be very sensitive to contaminants such as oxide material. For example, if an oxide layer exists on the surfaces of the extended impurity regions 20, the oxide layer acts as an etch stop layer during the chemical dry etching process. Thus, in certain embodiments of the present invention, the upper surfaces of the extended impurity regions 20 are cleaned using an oxide etchant such as diluted hydrofluoric acid prior to the chemical dry etching process. The chemical dry etching process may cause less etching damage as compared to the typical plasma etching process. However, the quality of the epitaxial growth may depend heavily on the surface condition of the underlying layer. Thus, in certain embodiments of the present invention, the semiconductor substrate 10 is cleaned using, for example, diluted hydrofluoric acid or a mixture of ammonium hydroxide (NH4OH), hydrogen peroxide and de-ionized water after the recessed regions 24 are formed.

Figure 10:
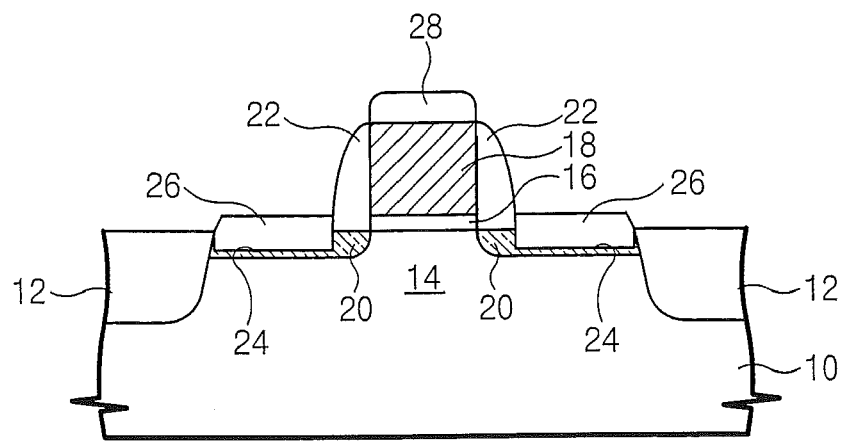

As shown in FIGS. 5 and 10, epitaxial layers 26 may be formed on the recessed regions 24 using, for example, a selective epitaxial growth technique (step S5 of FIG. 5). The epitaxial layers 26 may be formed to completely fill the recessed regions 24. Once the recessed regions are completely filled, the epitaxial layers 26 may be further grown to have top surfaces higher than the initial surface of the active region 14 (i.e., the surface height of the active region 14 prior to formation of the recessed regions 24). In certain embodiments of the present invention, the epitaxial layers 26 are grown at a temperature of less than 700 degrees Celsius to reduce and/or minimize further diffusion of the impurity ions in the extended impurity regions 20. The epitaxial layers 26 may be grown using an ultra high vacuum chemical vapor deposition (UHVCVD) technique. In the event that the gate pattern 18 is formed of a silicon layer such as, for example, a polysilicon layer, another epitaxial layer 28 may also be formed on the gate pattern 18. When the gate pattern 18 is formed to have a capping insulation layer, the epitaxial layer 28 may be omitted.

Figure 11:
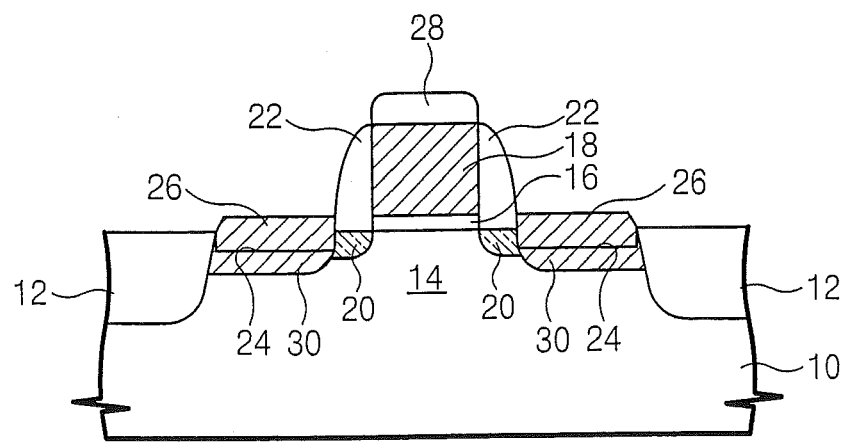

Referring to FIGS. 5 and 11, impurity ions are implanted into the epitaxial layers 26 using the gate pattern 18 and the sidewall spacers 22 as ion implantation masks, thereby forming high concentration impurity regions 30 (step S6 of FIG. 5). The high concentration impurity regions 30 are formed to have the same conductivity type as the extended impurity regions 20. The high concentration impurity regions 30 act as high concentration source/drain regions and may be formed to be deeper than the extended impurity regions 20 and/or to have higher impurity concentrations than the extended impurity regions 20. The high concentration impurity regions 30 and the extended impurity regions 20 constitute a pair of source/drain regions that are located at both sides of the gate pattern 18, respectively.

Figure 12:
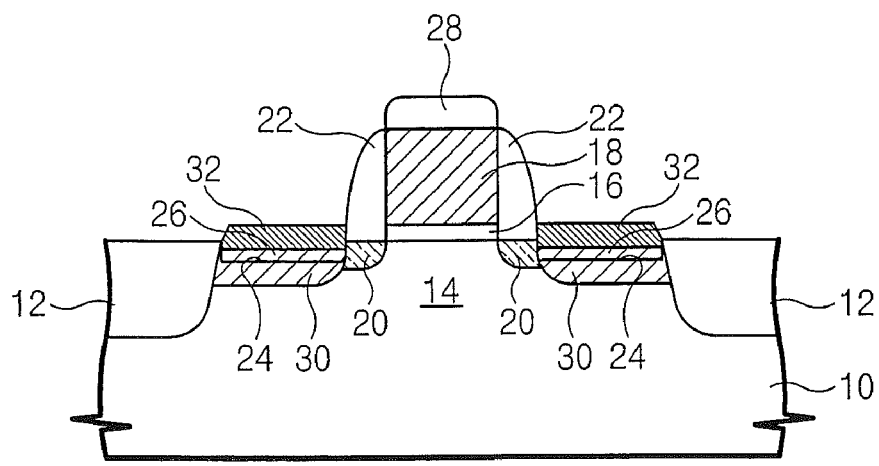

Referring to FIG. 12, metal silicide layers 32 may be formed at the surfaces of the high concentration impurity regions 30 using a self-aligned silicide technique. In the event that the epitaxial layer 28 is formed on the gate pattern 18, an additional metal silicide layer 34 may be formed at the epitaxial layer 28.

Pursuant to further embodiments of the present invention, methods of fabricating MOS transistors having a silicon-on-insulator (SOI) structure are provided. FIGS. 13 to 17 are cross sectional views illustrating methods of fabricating SOI transistors according to these further embodiments of the present invention.

Figure 13:
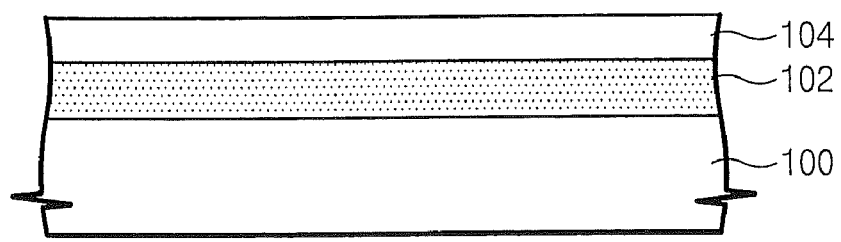
FIGS. 13 to 17 are cross sectional views illustrating methods of fabricating MOS transistors according to further embodiments of the present invention.
Figure 14:
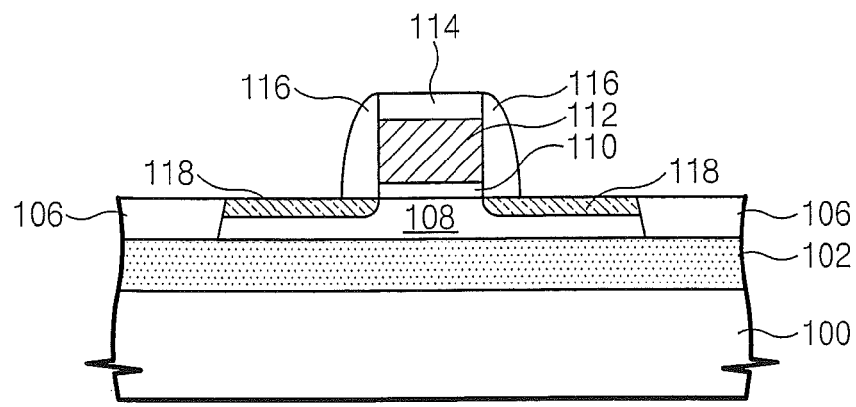

Referring to FIGS. 13 and 14, a buried insulating layer 102 and a semiconductor layer 104 are sequentially stacked on a supporting substrate 100 to provide an SOI substrate. As used herein, the term "semiconductor substrate" is meant to encompass semiconductor layers such as the semiconductor layer 104 that is provided above the insulating layer in an SOI semiconductor device. An isolation layer 106 is formed at the semiconductor layer 104 to define an active region 108. The isolation layer 106 is formed to be in contact with the buried insulating layer 102 such that the active region 108 is isolated by insulators. A gate insulating layer 110 is formed on the active region 108, and a gate pattern is formed on the gate insulating layer 110 to cross over the active region 108. As shown in FIG. 14, the gate pattern may comprise a gate electrode 112, and a capping insulation layer 114 may optionally be provided on the gate electrode 112.

Impurity ions are implanted into the semiconductor layer 104 using the gate pattern as an ion implantation mask to form an extended impurity region 118 on each side of the gate pattern. The extended impurity regions 118 may be formed to have a different conductivity type than the semiconductor layer 104. Sidewall spacers 116 are formed on sidewalls of the gate pattern. The sidewall spacers 116 may be formed, for example, of silicon oxide or silicon nitride.

Figure 15:
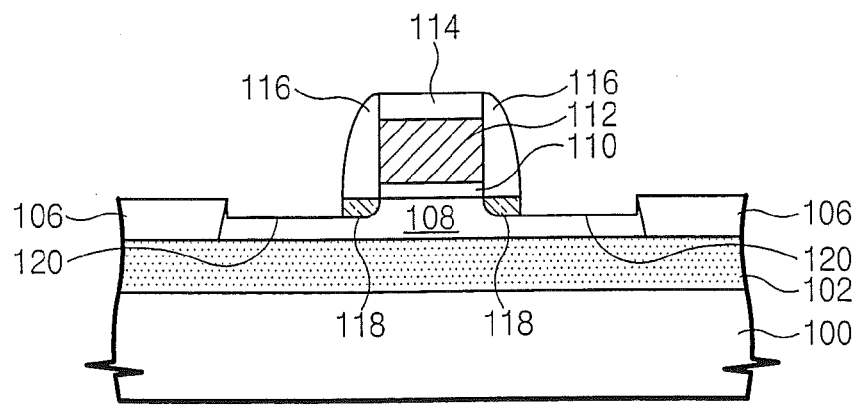

As shown in FIG. 15, the extended impurity regions 118 adjacent to the sidewall spacers 116 are recessed to form recessed regions 120. In certain embodiments of the present invention, each recessed region 120 is formed using a chemical dry etching technique that employs remote plasma. In certain embodiments of the present invention, the recessed regions 120 have a thickness of about 50 angstroms to 200 angstroms. Provision of such recesses may remove defective layers which may be generated during the ion implantation process used to form the extended impurity regions 118. The recessed regions 120 may be deeper or shallower than the extended impurity regions 118. The surfaces of the extended impurity regions 118 may be cleaned using, for example, an oxide etchant such as diluted hydrofluoric acid prior to the chemical dry etching process. The surfaces of the recessed regions 120 may be cleaned using, for example, diluted hydrofluoric acid or a mixture of ammonium hydroxide (NH4OH), hydrogen peroxide and de-ionized water after the chemical dry etching process.

Figure 16:
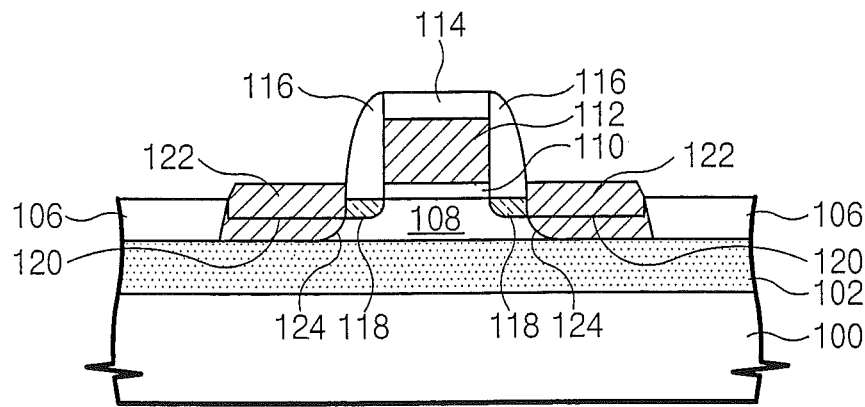

As shown in FIG. 16, epitaxial layers 122 are grown on the recessed regions 120 using, for example, a selective epitaxial growth technique. The epitaxial layers 122 are formed to fill the recessed regions 120. The top surfaces of the epitaxial layers 122 may be grown to be higher than the initial top surface of the active region 108. In certain embodiments of the present invention, the epitaxial layers 122 are grown at a temperature of less than 700 degrees Celsius to reduce and/or minimize diffusion of the impurities implanted in the extended impurity regions 118. The epitaxial layers 122 may be grown using, for example, an ultra high vacuum chemical vapor deposition (UHVCVD) technique. In other embodiments of the present invention, the epitaxial layers 122 may be grown using a chemical vapor deposition (CVD) technique. In the event that the capping insulation layer 114 is not formed, another epitaxial layer (not shown) may be formed on the gate electrode 112 during formation of the epitaxial layers 122.

Impurity ions are implanted into the epitaxial layers 122 using the gate pattern as an ion implantation mask in order to form the high concentration impurity regions 124. The high concentration impurity regions 124 may be formed to be deeper than the extended impurity regions 118 and to have higher impurity concentrations than the extended impurity regions 118. The high concentration impurity regions 124 are formed to have the same conductivity type as the extended impurity regions 118. The impurity concentration of the upper portions of the epitaxial layers 122 may be equal to or higher, than the impurity concentration of the lower portions of the epitaxial layers 122. The extended impurity regions 118 and the high concentration impurity regions 124 constitute a pair of source/drain regions.

Figure 17:
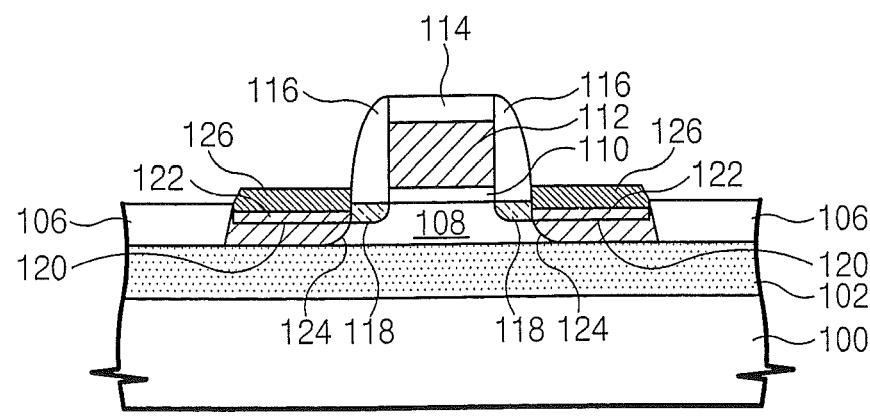

As shown in FIG. 17, metal silicide layers 126 may be formed at the surfaces of the high concentration impurity regions 30 using, for example, a self-aligned silicide technique. In the event that the epitaxial layer is formed on the gate electrode 112, an additional metal silicide layer (not shown) may be formed at the epitaxial layer on the gate electrode 112.

As discussed above, according to certain embodiments of the present invention, extended impurity regions may be recessed using a chemical dry etching technique to remove defective layers that may be generated during formation of the extended impurity regions. As such, the number of crystalline defects at the surfaces of the recessed impurity regions may be reduced and/or minimized, facilitating the growth of normal and uniform epitaxial layers on the recessed impurity regions even without the use of an additional annealing process and/or an increase in the annealing temperature. This may facilitate provision of high performance MOS transistors having elevated source/drain regions.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A method of forming a MOS transistor, the method comprising:

forming a buried insulating layer on a semiconductor substrate and a semiconductor layer on the buried insulating layer;

forming a gate pattern on the semiconductor layer;

implanting impurity ions in the semiconductor layer to form a first impurity doped region on a first side of the gate pattern and a second impurity doped region on a second side of the gate pattern;

removing a first portion of each of the first and second impurity doped regions to form respective first and second recesses;

forming an epitaxial layer on the first and second impurity doped regions that at least partially fills the first and second recesses, wherein the epitaxial layer comprises doped impurity ions to form a first high concentration impurity doped region adjacent the first side of the gate pattern and a second high concentration impurity doped region adjacent the second side of the gate pattern, and wherein depths of the first and second recesses are shallower than depths of the first and second impurity doped regions, and wherein the impurity concentration of the first high concentration impurity doped region exceeds the impurity concentration of the first impurity doped region, and the impurity concentration of the second high concentration impurity doped region exceeds the impurity concentration of the second impurity doped region.

2. The method of claim 1, further comprising forming first and second sidewall spacers on respective first and second sidewalls of the gate pattern prior to the removal of the first portions of the first and second impurity doped regions, and wherein an edge of the first recess is aligned with an outer wall of the first sidewall spacer and an edge of the second recess is aligned with an outer wall of the second sidewall spacer.

3. The method of claim 1, wherein the first and second high concentration impurity doped regions extend into the semiconductor layer below the epitaxial layer.

4. The method of claim 1, further comprising forming a metal silicide layer on the epitaxial layer, wherein a top surface of the metal silicide layer has a height which is higher than a height of the semiconductor layer under the gate pattern.

5. The method of claim 1, wherein the first and second high concentration impurity doped regions extend deeper into the semiconductor layer than do the first and second impurity doped regions.

6. The method of claim 2, wherein removing the first portion of each of the first and second impurity doped regions to form first and second recesses comprises removing the top 50 to 200 Angstroms portion of the first impurity doped region that is adjacent the first sidewall spacer and removing the top 50 to 200 Angstroms portion of the second impurity doped region that is adjacent the second sidewall spacer.

7. The method of claim 1, wherein after forming the epitaxial layer, an impurity concentration of the epitaxial layer has a gradient in a vertical direction and a peak impurity concentration of the epitaxial layer is near a top surface of the epitaxial layer.

8. The method of claim 1, wherein removing the first portion of each of the first and second impurity doped regions to form the first and second recesses is carried out directly after forming the first impurity doped region on the first side of the gate pattern and the second impurity doped region on the second side of the gate pattern.

9. The method of claim 1, wherein forming the epitaxial layer on the first and second impurity doped regions is carried out directly after removing the first portion of each of the first and second impurity doped regions to form respective first and second recesses.

10. The method of claim 1, wherein the first and second high concentration impurity doped regions are formed to be in contact with the buried insulating layer.

* * * * *